(12) United States Patent
Hirai (10) Patent No.: US 7,391,049 B2
(45) Date of Patent: Jun. 24, 2008

(54) THIN-FILM TRANSISTOR, THIN-FILM TRANSISTOR SHEET AND THEIR MANUFACTURING METHOD

(75) Inventor: Katsura Hirai, Hachioji (JP)

(73) Assignee: Konica Minolta Holdings, Inc. (JP)

( * ) Notice: Subject to any disclaimer, the term of this patent is extended or adjusted under 35 U.S.C. 154(b) by 0 days.

(21) Appl. No.: 11/349,383

(22) Filed: Feb. 6, 2006

(65) Prior Publication Data

US 2006/0138423 A1    Jun. 29, 2006

(51) Int. Cl.
*H01L 29/08* (2006.01)
*H01L 29/76* (2006.01)
(52) U.S. Cl. .................. 257/40; 257/288; 257/E29.117
(58) Field of Classification Search ................ 257/40, 257/288, 368, E29.117, 347
See application file for complete search history.

(56) References Cited

U.S. PATENT DOCUMENTS

| | | | | |
|---|---|---|---|---|
| 6,330,042 | B1 * | 12/2001 | Kang et al. | 349/43 |
| 6,331,356 | B1 * | 12/2001 | Angelopoulos et al. | 428/411.1 |
| 6,335,539 | B1 * | 1/2002 | Dimitrakopoulos et al. | 257/40 |
| 6,794,220 | B2 | 9/2004 | Hirai et al. | |
| 6,949,762 | B2 * | 9/2005 | Ong et al. | 257/40 |
| 2002/0025391 | A1 * | 2/2002 | Angelopoulos et al. | 428/1.4 |

\* cited by examiner

*Primary Examiner*—Tuan N. Quach
(74) *Attorney, Agent, or Firm*—Cantor Colburn LLP

(57) ABSTRACT

Disclosed are a process of manufacturing a thin-film transisitor sheet and a thin-sheet transistor sheet manufactured by the process, the process comprising providing a gate busline on a substrate, providing, on the surface of the substrate on the gate busline side, an insulation layer capable of receiving a fluid electrode material, supplying the fluid electrode material to the insulation layer, the fluid electrode material being allowed to permeate the insulation layer, forming a gate electrode from the permeated fluid electrode material to be in contact with the gate busline, forming a gate insulating layer on the gate electrode, and forming a semiconductor layer on the gate insulating layer.

4 Claims, 4 Drawing Sheets

THIN-FILM TRANSISTOR, THIN-FILM TRANSISTOR SHEET AND THEIR MANUFACTURING METHOD

CROSS REFERENCE TO RELATED APPLICATION

The present invention claims priority under 35 U.S.C. §119 to Japanese Application No. 2003-079514 filed Mar. 24, 2003 which is incorporated herein by reference.

FIELD OF THE INVENTION

An embodiment of the present invention relates to a thin-film transistor, a thin-film transistor sheet, and their manuacturing method.

BACKGROUND OF THE INVENTION

In recent years, with the spread of information terminals, there are increasing demands for a flat panel display that serves as a display for a computer. Further, with development of the information technology, there has been increased a chance for information offered in a form of a sheet of paper medium in the past to be offered in an electronic form. An electronic paper or a digital paper is demanded increasingly as a display medium for a mobile that is thin, lightweight and handy.

In the case of a display device of a flat sheet type, a display medium is generally formed using an element that employs a liquid crystal, organic EL or electrophoresis method. In the display medium of this kind, a technology for using an active driving element comprised of a thin-film transistor (TFT), serving as an image driving element, is the main current for ensuring uniform image brightness and an image rewriting speed.

A TFT is ordinarily manufactured by a process comprising forming, on a glass substrate, a semiconductor layer of a-Si (amorphous silicone) or p-Si (poly-silicone) and metal films of source, drain and gate electrodes, in the order. In the manufacture of a flat panel display employing such a TFT, a photolithography step with high precision is required in addition to a thin layer forming step requiring a vacuum line carrying out a CVD method or a sputtering method or a high temperature treatment step, which results in great increase of manufacturing cost or running cost. Recent demand for a large-sized display panel further increases those costs described above.

In order to overcome the above-described defects, an organic thin-film transistor employing an organic semiconducting material has been extensively studied (see, for example, Japanese Patent O.P.I. Publication No. 10-190001 1 and "Advanced Material", 2002, No. 2, p. 99 (review)). Since the organic thin-film transistor can be manufactured at low temperature employing a lightweight substrate difficult to be broken, a flexible display employing a resin film as a substrate can be realized (see, for example, SID '02 Digest P. 57). Further, employing an organic semiconducting material allowing a wet process such as a printing method or a coating method, a display manufacturing process, which provides excellent productivity and reduced cost, is expected to be realized.

A conventional manufacturing process of a TFT or a TFT sheet comprises forming a film of a metal such as chromium, nickel or aluminum according to a sputtering method, and processing the film according to photolithography including etching to form a gate busline or a gate electrode. However, this process has problems in that gate leakage is likely to occur which is caused by minute unevenness of the electrode surface, unevenness (herein also referred to as hillocks) of a layer adjacent to the electrode, which deteriorates smoothness of the electrode surface, or edge portions of the electrode.

Further, there is problem that a TFT or a TFT sheet employing a resin sheet substrate, in which unevenness of the sheet surface deteriorates smoothness of the electrode surface, is likely to leak from the gate busline or the gate electrode, as compared with a conventional TFT or TFT sheet employing a glass plate having a smooth surface.

SUMMARY OF THE INVENTION

An embodiment of the present invention has been made in view of the above. An embodiment of the invention may minimize gate leakage caused by the hillocks or edge portions of the electrode in a TFT panel or in a TFT sheet, and particularly to minimize gate leakage when a resin sheet is used as a substrate of the TFT panel or the TFT sheet.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The above embodiment of the invention may be attained by the following constitutions.

What is claimed is:

1. A thin-film transistor comprising a substrate and provided thereon, an insulation layer capable of receiving a fluid electrode material, a gate electrode, a gate insulating layer, a semiconductor layer, a source electrode and a drain electrode, the source electrode and the drain electrode connecting each other through the semiconductor layer, wherein the gate electrode is formed from the fluid electrode material which has been allowed to permeate the insulation layer.

2. The thin-film transistor of item 1 above, wherein the substrate is comprised of a resin.

3. The thin-film transistor of item 1 above, wherein the fluid electrode material is a solution of an electrically conductive polymer or a dispersion liquid of an electrically conductive polymer.

4. The thin-film transistor of item 1 above, wherein the semiconductor layer is comprised of an organic semiconductor material.

5. A thin-film transistor sheet comprising a substrate, a gate busline, an insulation layer, a gate electrode comprised of a fluid electrode material, a gate insulating layer, and a semiconductor layer, the gate electrode being formed in the insulation layer and being in contact with the gate busline, wherein the thin-film transistor sheet is manufactured by a process comprising: providing a gate busline on a substrate, providing, on the surface of the substrate on the gate busline side, an insulation layer capable of receiving a fluid electrode material, supplying the fluid electrode material to the insulation layer, the fluid electrode material being allowed to permeate the insulation layer, forming, in the insulating layer, a gate electrode from the permeated fluid electrode material to be in contact with the gate busline, forming a gate insulating layer on the gate electrode and forming a semiconductor layer on the gate insulating layer.

1-1 A thin-film transistor comprising a substrate and provided thereon, a gate electrode, a gate insulating layer, and a semiconductor layer in that order, a source electrode and a drain electrode connecting each other through the semiconductor layer, wherein the gate electrode is formed from a fluid electrode material which has been allowed to permeate an insulation layer capable of receiving the fluid electrode material.

1-2 The thin-film transistor of item 1-1 above, wherein the substrate is comprised of a resin.

1-3 The thin-film transistor of item 1-1 or 1-2 above, wherein the fluid electrode material is a solution of an electrically conductive polymer or a dispersion liquid of an electrically conductive polymer.

1-4 The thin-film transistor of any one of items 1-1 through 1-3 above, wherein the semiconductor layer is comprised of an organic semiconductor material.

1-5 A process of manufacturing a thin-film transistor sheet, the process comprising: providing a gate busline on a substrate, providing an insulation layer on the substrate surface on the gate busline side, the insulation layer being capable of receiving a fluid electrode material; and forming a gate electrode by supplying the fluid electrode material to the insulation layer where the fluid electrode material is allowed to permeate the insulation layer.

1-6 The process of item 1-5 above, wherein the substrate is comprised of a resin.

1-7 The process of item 1-5 or 1-6 above, wherein the fluid electrode material is a solution of an electrically conductive polymer or a dispersion of an electrically conductive polymer.

1-8 The process of any one of items 1-5 through 1-7 above, wherein the semiconductor layer is comprised of an organic semiconductor material.

1-9 A thin-film transistor sheet manufactured according to the process of any one of items 1-5 through 1-8 above.

The present inventor has made a study on a method of forming a gate electrode with a smooth surface such that the smoothness of the gate electrode surface is not deteriorated by unevenness of the substrate surface, etc., and has completed the invention.

The present invention will be detailed below.

The thin-film transistor of an embodiment of the invention is characterized in that the gate electrode is formed from a fluid electrode material which has been allowed to permeate an insulation layer (hereinafter also referred to simply as insulation layer) capable of receiving the fluid electrode material.

In an embodiment of the invention, the fluid electrode material is a solution of an electrically conductive material or a dispersion liquid of an electrically conductive material. As the electrically conductive material, an electrically conductive polymer or metal particles are suitably used, and an electrically conductive polymer is preferably used.

As a solvent or dispersion medium for the fluid electrode material solution or dispersion in the invention, water or any solvent can be used, however, the solvent or dispersion medium preferably contains water in an amount of not less than 30 by weight, in view of its affinity to the insulation layer described later. The solvent used is preferably a water soluble organic solvent.

Examples of the water soluble organic solvent usable in the invention include alcohols (for example, methanol, ethanol, isopropanol, butanol, isobutanol, secondary butanol, tertiary butanol, pentanol, hexanol, cyclohexanol, and benzyl alcohol); polyhydric alcohols (for example, ethylene glycol, diethylene glycol, triethylene glycol, polyethylene glycol, propylene glycol, dipropylene glycol, polypropylene glycol, butylene glycol, hexane diol, pentane diol, glycerin, pentane triol, and thioglycol); polyhydric alcohol ethers (for example, ethylene glycol monomethyl ether, ethylene glycol monoethyl ether, ethylene glycol monobutyl ether, propylene glycol monomethyl ether, propylene glycol monobutyl ether, ethylene glycol monomethyl ether acetate, triethylene glycol monomethyl ether, triethylene glycol monoethyl ether, triethylene glycol monobutyl ether, ethylene glycol monophenyl ether, and propylene glycol monophenyl ether); amines (for example, ethanolamine, diethanolamine, triethanolamine, N-methyldiethanolamine, N-ethyldiethanolamine, morpholine, N-ethylmorpholine, ethylenediamine, diethylenediamine, triethylenetetramine, tetraethylenepentamine, polyethylene imine, pentamethyldiethylenetriamine, and tetramethylpropylenediamine); amides (for example, formamide. N,N-dimethylformamide, and N,N-dimethylacetamide); heterocyclic compounds (for example, 2-pyrrolidone, N-methyl-2-pyrrolidone, cyclohexylpyrrolidone, 2-oxazolidone, and 1,3-dimethyl-2-imidazolidinone); sulfoxides (for example, dimethylsulfoxide); sulfones (for example, sulfolane); urea; acetonitrile and acetone. The water soluble organic solvents are preferably polyhydric alcohols, and more preferably mixtures of polyhydric alcohols and plyhydric alcohol ethers.

These water soluble organic solvents may be used singly or as a mixture of two or more thereof. The content of the water soluble organic solvent is preferably from 5 to 70% by weight, and more preferably from 10 to 30% by weight based on the total content of the solvent used. Various surfactants can be used. It is preferred that a surfactant is added to an electrically conductive material solution or dispersion used particularly in an ink jet method so as to give a surface tension of from $30 \times 10^{-3}$ to $40 \times 10^{-3}$ N/m. When an electrically conductive polymer doped with an anion is used, a nonionic surfactant is especially suitably used. The electrically conductive material solution or dispersion used in the ink jet method has a viscosity of preferably from 1 to 15 cp, the viscosity being obtained by adjusting the concentration of the electrically conductive material of the solution or dispersion.

Further, known electrically conductive polymers whose electrical conductivity is improved by doping are preferably used. Examples thereof include electrically conductive polyaniline, electrically conductive polypyrrole, electrically conductive polythiophene, and complex of electrically conductive polyethylenedioxythiophene and polystyrene sulfonic acid.

As the electrically conductive polymer, a semiconductive material, preferably a π-conjugate oligomer or polymer used in the semiconductor layer described later, which has been subjected to doping treatment, is preferably used. Examples thereof include a poly(ethylenedioxythiophene)-polystyrene sulfonic acid complex (PEDOT/PSS complex, for example, Baytron P produced by Bayer Co., Ltd).

A dopant used in the doping treatment is preferably an anionic dopant (p-type dopant) in view of stability. The conductivity of the electrically conductive polymer is preferably not less than 0.01 S/cm, and more preferably not less than 1 S/cm.

The doping herein means that an electron accepting molecule (acceptor) or an electron donating molecule (donor) is incorporated in the oligomer or polymer described above as a dopant. Employed as the dopant used in the present invention may be either acceptor or donor.

Examples of the acceptor include halogens such as $Cl_2$, $Br_2$, $I_2$, ICl, $ICl_3$, IBr, and IF; Lewis acids such as $PF_5$, $AsF_5$, $SbF_5$, $BF_3$, $BCl_3$, $BBr_3$, and $SO_3$; protonic acids such as HF, HCl, $HNO_3$, $H_2SO_4$, $HClO_4$, $FSO_3H$, $ClSO_3H$, and $CF_3SO_3H$; organic acids such as acetic acid, formic acid, and amino acid; transition metal compounds such as $FeCl_3$, FeOCl, $TiCl_4$, $ZrCl_4$, $HfCl_4$, $NbF_5$, $NbF_5$, $NbCl_5$, $TaCl_5$, $MoCl_5$, $WF_5$, $WCl_5$, $UF_6$, $LnCl_3$ (Ln=lanthanoid such as La, Ce, Nd, and Pr, and Y), and electrolyte anions such as $Cl^-$, $Br^-$, $I^-$, $ClO^{4-}$, $PF^{6-}$, $AsF^{5-}$, $SbF^{6-}$, $BF^{4-}$, and a sulfonate anion.

Examples of the donor include alkali metals such as Li, Na, K, Rb, and Cs; alkaline earth metals such as Ca, Sr, and Ba; rare earth metals such as Y, La, Ce, Pr, Nd, Sm, Eu, Gd, Tb, Dy, Ho, Er, and Yb; an ammonium ion; $R_4P^+$, $R_4AS^+$, and $R_3S^+$; and acetylcholine.

Doping these dopants may be carried out employing any conventional method, for example, a method in which the dopants are incorporated into an organic semiconductor layer having been formed or a method in which the dopants are incorporated into an organic semiconductor layer while the layer is formed. The former methods include a gas phase doping in which gaseous dopants are employed, a liquid phase doping in which doping is carried out while the layer is brought into contact with a dopant solution or a liquid dopant, and a solid phase doping in which diffusion doping is carried out while the layer is brought into contact with a solid dopant so that the dopant diffuse into the layer. In the liquid phase doping, it is possible to adjust the doping efficiency by means of electrolysis. In the latter method, a solution or a dispersion each containing an organic semiconductor material and a dopant may be coated and subsequently dried. For instance, when a vacuum deposition method is used, dopants may be incorporated in the layer by co-deposition of an organic semiconductor material and a dopant. Further, when the layer is formed employing a sputtering method, sputtering is carried out utilizing the two targets of an organic semiconductor material and a dopant, whereby the dopant can be incorporated in the layer. Still further, as other methods, it is possible to use any of chemical doping such as electrochemical doping or photoinitiation doping, or physical doping such as an ion injection method as shown in, for example, a publication "Kogyo Zairyo", Volume 34, No. 4, page 55 (1986).

As the dispersion liquid of metal particles, known electrically conductive pastes may be used, but a dispersion liquid ,in which metal particles with a particle size of from 1 to 50 nm, and preferably from 1 to 10 nm, is preferably used.

Materials for the metal particles include platinum, gold, silver, nickel, chromium, copper, iron, tin, antimony, lead, tantalum, indium, palladium, tellurium, rhenium, iridium, aluminum, ruthenium, germanium, molybdenum, tungsten, and zinc.

The dispersion liquid of metal particles is preferably a metal particle dispersion liquid in which metal particles of these metals are dispersed in a dispersion medium such as water or an organic solvent in the presence of an organic dispersion stabilizer.

Methods for preparing such a metal particle dispersion liquid include a physical preparation method such as a gas vaporization method, a sputtering method, or a metallic vapor preparation method and a chemical preparation method such as a colloid method or a co-precipitation method in which metal ions are reduced in a liquid phase to produce metal particles. The metal particles dispersion are preferably ones prepared according to a colloid method disclosed in Japanese Patent O.P.I. Publication Nos. 11-76800, 11-80647, 11-319538, and 2000-239853, or ones prepared according to a gas vaporization method disclosed in Japanese Patent O.P.I. Publication Nos. 2001-254185, 2001-53028, 2001-35814, 2001-35255, 2001-124157 and 2000-123634. An electrode pattern is formed from these metal particle dispersions dried, and optionally subjected to heat treatment at from 100 to 300° C., and preferably from 150 to 200° C., whereby the metal particles are heat-fused to form an electrode or a circuit in an intended form.

In order to form a gate electrode comprised of the fluid electrode material which has been allowed to permeate the insulation layer capable of receiving the fluid electrode material, the fluid electrode material may be ejected in the electrode pattern onto the insulation layer according to an ink jet process, or may be printed in the electrode pattern onto the insulation layer according to a printing method such as letterpress printing, intaglio printing, planographic printing or screen printing. As an ink jet head of an ink jet printer used in the ink jet method, a conventional ink jet head such as a piezo type of a thermal type can be suitably used. The ink jet printer may be of on-demand type or continuous type.

Next, the insulation layer capable of receiving a fluid electrode material will be explained.

The insulation layer is a layer which the electrically conductive material permeates. The insulation layer can be divided into two types of layers, that is, a swellable insulation layer and a void-containing insulation layer.

The swellable insulation layer contains gelatin, a water soluble polymer other than gelatin, latexes, and polyurethanes, which may be used singly or in combination. The swellable insulation layer preferably contains gelatin or a water soluble polymer other than gelatin, in view of its high ink absorption and drying property.

As gelatin, any gelatin made from animal collagen can be used, but gelatin made from pig skin, cow skin or cow bone collagen is preferable. The kind of gelatin is not specifically limited, but lime-processed gelatin, acid processed gelatin or gelatin derivatives (for example, gelatin derivatives disclosed in Japanese Patent Publication Nos. 38-4854, 39-5514, 40-12237, and 42-26345, U.S. Pat. Nos. 2,525,753, 2,594, 293, 2,614,928, 2,763,639, 3,118,766, 3,132,945, 3,186,846 and 3,312,553 and British Patent Nos. 861,414 and 103,189) can be used singly or in combination. The acid processed gelatin is advantageously used in view of water resistance.

Examples of the water soluble polymer other than gelatin preferably used in the swellable insulation layer include polyvinyl alcohol, polyvinyl pyrrolidone, polyvinyl pyridinium halide, modified polyvinyl alcohol such as polyvinyl formal or their derivatives (see Japanese Patent O.P.I. Publication Nos. 60-145879, 60-220750, 61-143177, 61-235182, 61-235183, 61-237681 and 61-261089), an acryl group-containing polymer (disclosed in Japanese Patent O.P.I. Publication Nos. 168651/1985 and 9988/1987) such as polyacrylamide, polydimethylacrylamide, polydimethylaminoacrylate, poly(sodiumacrylate), a salt of methacrylic acid-acrylic acid copolymer, poly(sodiummethacrylate), or acrylic acid-vinyl alcohol copolymer, a natural polymer or its derivatives (disclosed in Japanese Patent O.P.I. Publication Nos. 59-174382, 60-262685, 61-143177, 61-181679, 61-193879 and 61-287782) such as starch, oxidation starch, carboxylated starch, dialdehyde starch, cationated starch, dextrin, sodium alginate, gum arabic, casein, pullulan, dextrane, methylcellulose, ethylcellulose, carboxymethylcellulose or hydroxypropylcellulose, and a synthetic polymer (disclosed in Japanese Patent O.P.I. Publication Nos. 61-32787, 61-237680 and 61-277483) such as polyethylene glycol, polypropylene glycol, polyvinyl ether, polyglycerin, maleic acid-alkylvinylether copolymer, maleic acid-N-vinylpyrrole copolymer, styrene-maleic anhydride copolymer or polyethylene imine). Of these, the preferable are polyvinyl pyrrolidones, polyvinyl alcohols or polyalkylene oxides.

The void-containing insulation layer is preferably a coated layer of a composition containing fine particles and optionally a water soluble binder.

Listed as fine particles usable for the void-containing ink receptive layer are inorganic particles or organic particles. Inorganic particles are preferred, since fine particles are easily obtained. Examples of the inorganic particles include white inorganic pigments such as, for example, precipitated calcium carbonate, heavy calcium carbonate, magnesium carbonate, kaolin, clay, talc, calcium sulfate, barium sulfate, titanium dioxide, zinc oxide, zinc hydroxide, zinc sulfide, zinc carbonate, hydrotalcite, aluminum silicate, diatomaceous earth, calcium silicate, magnesium silicate, synthetic non-crystalline silica, colloidal silica, alumina, colloidal alumina, false boehmite, aluminum hydroxide, lithopone, zeolite, magnesium hydroxide, and the like. The particles may exist in the void-containing insulation layer in the form of primary particles, or aggregated secondary particles.

The inorganic particles are preferably alumina, false boehmite, colloidal silica, or silica particles synthesized by a gas phase method, and more preferably silica particles synthesized by a gas phase method. The silica particles synthesized by a gas phase method may be those surface-treated with Al. The Al content of the silica particles surface-treated with Al is from 0.05 to 5% by weight based on the silica.

The particle size of the particles may be any, but is preferably not more than 1 μm, more preferably not more than 0.2 μm, and most preferably not more than 0.1 μm. Herein, the lower limit of the particle size is not specifically limited, but is preferably, more preferably not less than 0.003 μm, and more preferably not less than 0.005 μm, in view of manufacture of the particles.

The average particle size of the particles described above is determined in such a manner that particles located at the cross-section or the surface of the porous layer are observed employing an electron microscope, the size of randomly selected 100 particles are determined, and the simple average (arithmetic average) is computed. The particle size of the individual particle is expressed in terms of a diameter of a circle having the same area as the projected area of the particle.

The particles may exist in the porous layer in the form of primary particles, secondary particles or higher order particles. The particles used for the calculation of the average particle size are those independently existing in the porous layer.

The particle content of the aqueous coating solution is preferably from 5 to 40% by weight, and more preferably from 7 to 30% by weight.

The water soluble binder contained in the void-containing insulation layer is not specifically limited, and may be any known water soluble binder. Examples of the water soluble binder include gelatin, polyvinyl pyrrolidone, polyethylene oxide, polyacryl amide and polyvinyl alcohol. Polyvinyl alcohol is especially preferred.

Polyvinyl alcohol interacts with the inorganic particles, exhibits strong retention property to the inorganic particles, and is relatively low in humidity dependency of hygroscopic property. The polyvinyl alcohols preferably used in the invention include an ordinary polyvinyl alcohol obtained by hydrolyzing polyvinyl acetate, and a modified polyvinyl alcohol such as a cation-modified polyvinyl alcohol or an anion-modified polyvinyl alcohol.

The polyvinyl alcohol obtained by hydrolyzing polyvinyl acetate has an average polymerization degree of preferably not less than 300, and more preferably 1000 to 5,000. The polyvinyl alcohol has a saponification degree of preferably 70 to 100%, and more preferably 80 to 99.5%.

The cation-modified polyvinyl alcohol is a polyvinyl alcohol having a primary to tertiary amino group or a quaternary ammonium group in its main or side chain, and is obtained by saponifying a copolymer of vinyl acetate and an ethylenically unsaturated monomer having a cationic group.

Examples of the ethylenically unsaturated monomer having a cationic group include trimethyl-(2-acrylamide-2,2-dimethylethyl)ammonium chloride, trimethyl-(3-acrylamide-3,3-dimethylpropyl)ammonium chloride, N-vinylimidazole, N-vinyl-2-methylimidazole, N-(3-dimethylaminopropyl)methacrylamide, hydroxyethyltrimethylammonium chloride, trimethyl-(3-methacrylamidopropyl)ammonium chloride, and N-(1,1-dimethyl-3-dimethylaminopropyl)acrylamide.

The content of the monomer having a cationic group in the cation-modified polyvinyl alcohol is preferably 0.1 to 10 mol %, more preferably 0.2 to 5 mol %, based on the vinyl acetate content.

Examples of the anion-modified polyvinyl alcohol include polyvinyl alcohol having an anionic group disclosed in Japanese Patent O.P.I. Publication No. 1-206088, a copolymer of vinyl alcohol and a vinyl compound having a water-solubilizing group disclosed in Japanese Patent O.P.I. Publication Nos. 61-237681 and 63-307979, and a modified polyvinyl alcohol having a water-solubilizing group disclosed in Japanese Patent O.P.I. Publication Nos. 7-285265.

Examples of the nonion-modified polyvinyl alcohol include a polyvinyl alcohol derivative prepared by the addition of polyethylene oxide to a part of hydroxy groups of polyvinyl alcohol disclosed in Japanese Patent O.P.I. Publication No. 7-9758, and a block copolymer of a vinyl compound having a hydrophobic group and vinyl alcohol disclosed in Japanese Patent O.P.I. Publication No. 8-25795.

Polyvinyl alcohols can be used as a mixture of two or more thereof, according to the polymerization degree and kinds of modification. When polyvinyl alcohol with a polymerization degree of not less than 2000, polyvinyl alcohol with a polymerization degree of not more than 1000 is in advance added in an amount of 0.05 to 10% by weight, and preferably 0.1 to 5% by weight based on the inorganic particle weight to an inorganic particle dispersion, and then the polyvinyl alcohol with a polymerization degree of not more than 1000 is added, which exhibits no marked viscosity increase.

The content ratio of the particles to the water soluble polymer in the void-containing insulation layer is preferably 2 to 20 by weight. This ratio in the void-containing insulation layer maintains a proper void ratio and sufficient void volume, prevents an excessive water soluble polymer binder from swelling and clogging the voids during ink jet printing, maintains a proper absorption speed of the electrically conductive material, and prevents cracks from occurring in the void-containing insulation layer. The content ratio of the particles to the water soluble polymer in the void-containing insulation layer is more preferably 2.5 to 12, and still more preferably 3 to 10.

In the invention, the insulation layer is preferably the void-containing insulation layer. The void-containing insulation layer increases permeation speed of the electrode material and improves accuracy of the electrode pattern. The electrical conductivity of portions of the insulation layer which the electrode material have permeated is high as compared with that of the swellable insulation layer. Further, kinds of fine particles or the water soluble polymer can be suitably selected according to properties of the electrically conductive material, and the permeation speed of the electrically conductive material can be easily adjusted.

The thickness of the insulation layer is preferably from 0.05 to 50 μm, and more preferably from 0.5 to 20 μm.

Figure 1:
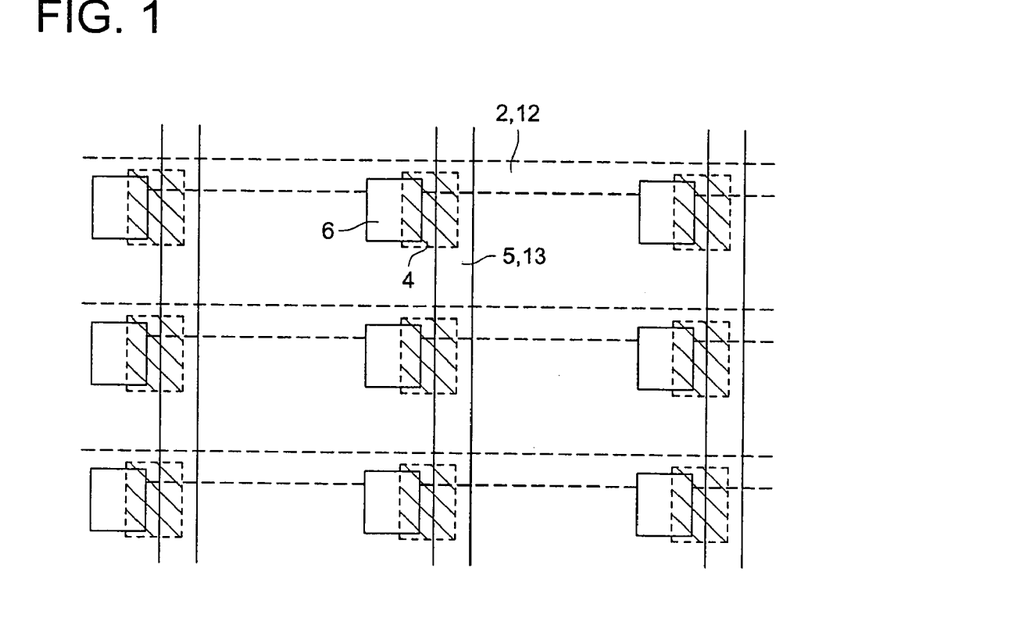
FIG. 1 is one embodiment showing a structure of the TFT sheet of the invention.

The TFT of the invention is preferably a bottom gate type one in which comprises a substrate and provided thereon, a gate electrode, a gate insulating layer, and channel made of a semiconductor layer in that order, a source electrode and a drain electrode combining with each other through the channel. The TFT sheet is one in which many of the TFT are arranged on a sheet substrate so that the TFTs are connected through a gate busline and a source busline, as is shown in FIG. 1. In FIG. 1, numerical number 2 represents gate electrode, numerical number 4 a semiconductor layer, numerical number 5 a source electrode, numerical number 6 a drain electrode, numerical number 12 a gate busline, and numerical number 13 a source busline.

Figure 2:
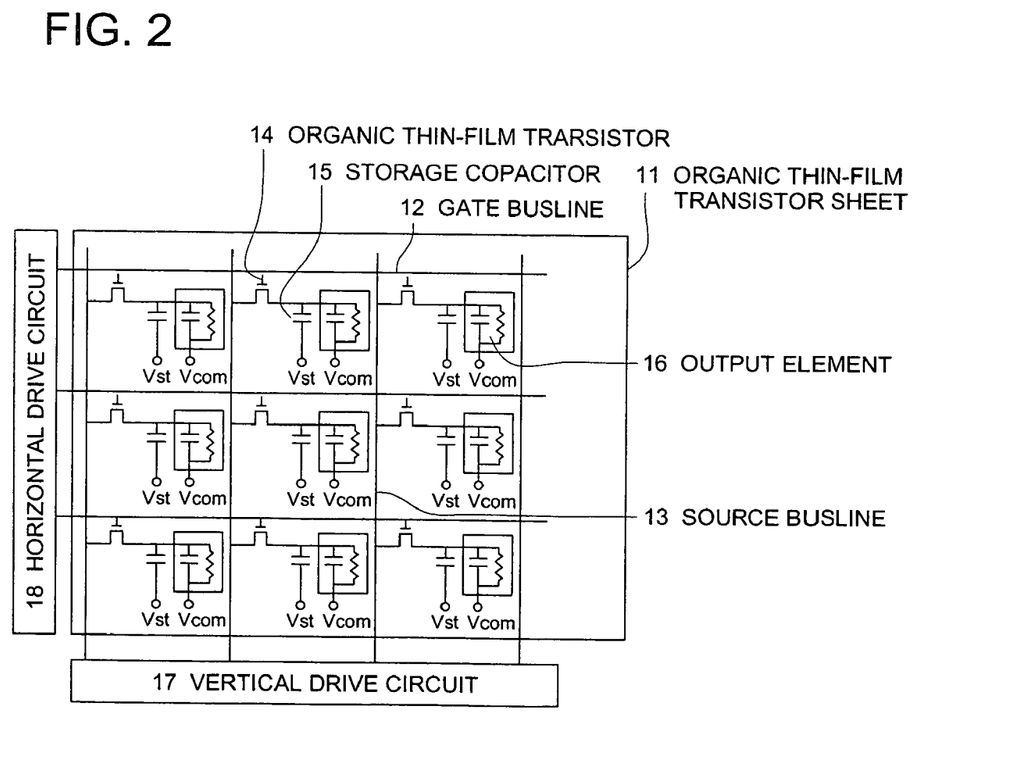
FIG. 2 is a schematic equivalent circuit diagram of one example of the TFT sheet of the invention.

FIG. 2 is a schematic equivalent circuit diagram of one example of the thin-film transistor sheet, in which many TFTs are arranged.

The thin-film transistor sheet 11 comprises many of thin-film transistor 14 arranged in a matrix form. Numerical number 12 is a gate busline of the gate electrode of the thin-film transistor 14, and numerical number 13 a source busline of the source electrode of the thin-film transistor 14. Output element 16 is connected to the drain electrode of the thin-film transistor 14. The output element 16 is for example, a liquid crystal or an electrophoresis element, and constitutes pixels in a display. In FIG. 2, liquid crystal as output element 16 is shown in an equivalent circuit diagram comprised of a capacitor and a resistor. Numerical number 15 shows a storage capacitor, numerical number 17 a vertical drive circuit, and numerical number 18 a horizontal drive circuit.

Figure 3:
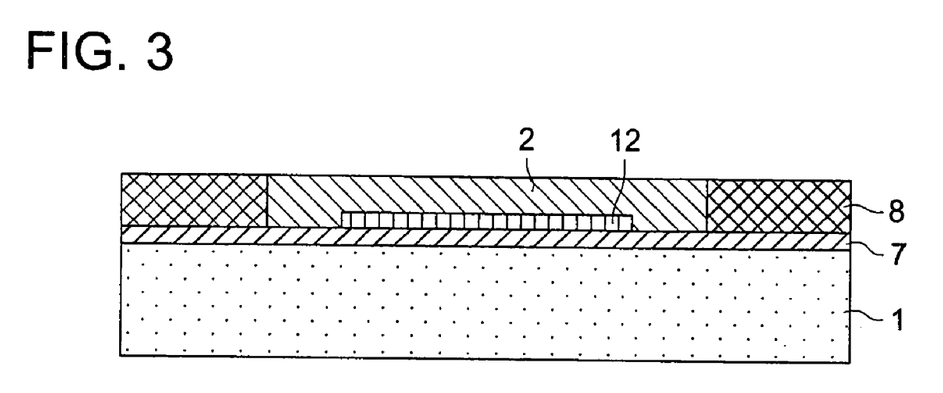
FIG. 3 is an illustration showing one pixel comprising a gate electrode formed by fluid electrode material having permeated an insulation layer capable of receiving the fluid electrode material, the insulation layer being provided on a gate busline.

FIG. 3 is an illustration showing a structure of one pixel. The structure is obtained by forming insulation layer 8 capable of receiving a fluid electrode material on gate busline 12 which is provided on a subbing layer 7 on substrate 1, and forming gate electrode 2 comprised of the fluid electrode material, which has been supplied to the insulation layer and has been allowed to permeate the insulation layer, so that the gate electrode 2 connects the gate busline 12.

Figure 4:
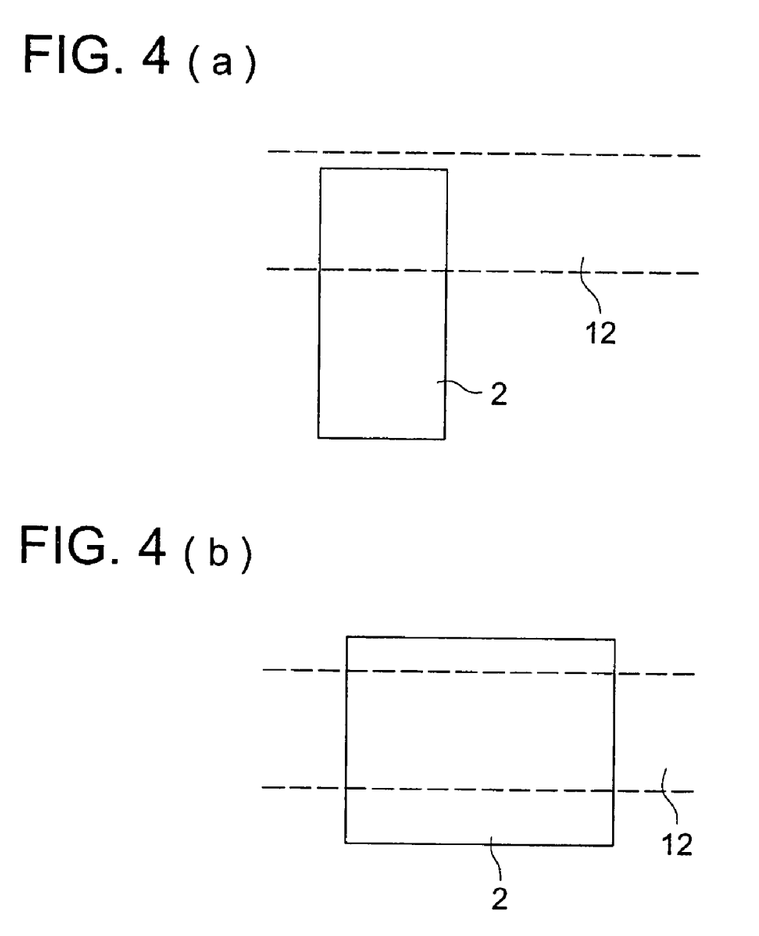
FIG. 4 is an illustration showing the position relationship between a gate busline and a gate electrode.

Arrangement of the gate electrode 2 may be any as long as it connects the gate busline 12, as is shown in FIG. 4(*a*) or 4(*b*).

Figure 5:
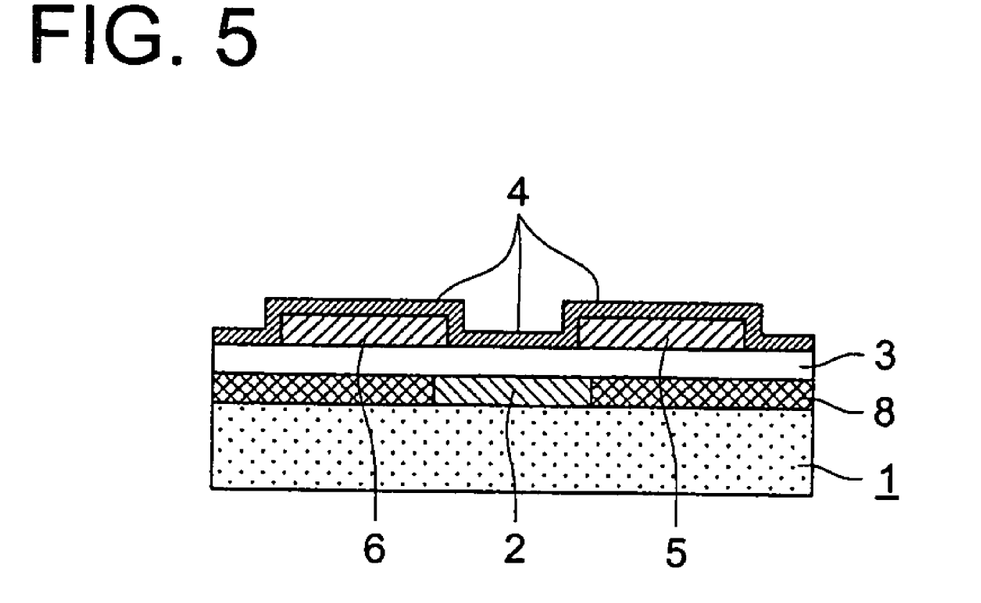
FIG. 5 shows one embodiment of the structure of the thin-film transistor in the invention.
Figure 6:
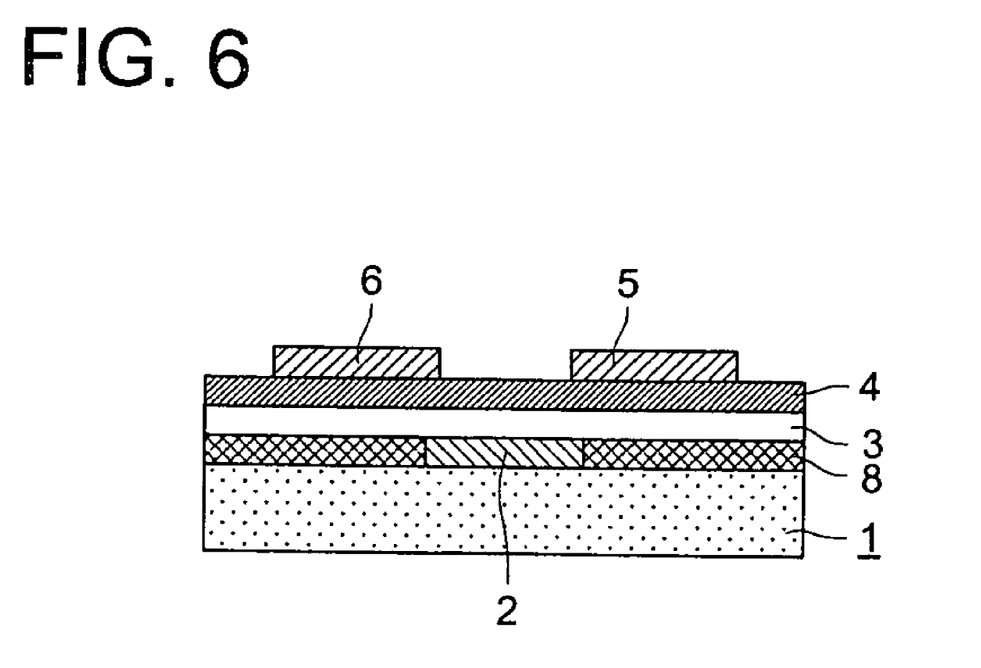
FIG. 6 shows another embodiment of the structure of the thin-film transistor in the invention.

FIG. 5 shows one embodiment of the structure of the thin-film transistor in the invention. FIG. 6 shows another embodiment of the structure of the thin-film transistor in the invention. In FIGS. 5 and 6, numerical number 1 is a substrate, numerical number 2 is a gate electrode, numerical number 3 a gate insulating layer, numerical number 4 a semiconductor layer, numerical number 5 a drain electrode, and numerical number 6 a source electrode, and numerical number 8 an insulation layer capable of receiving a fluid electrode material.

Figure 7:
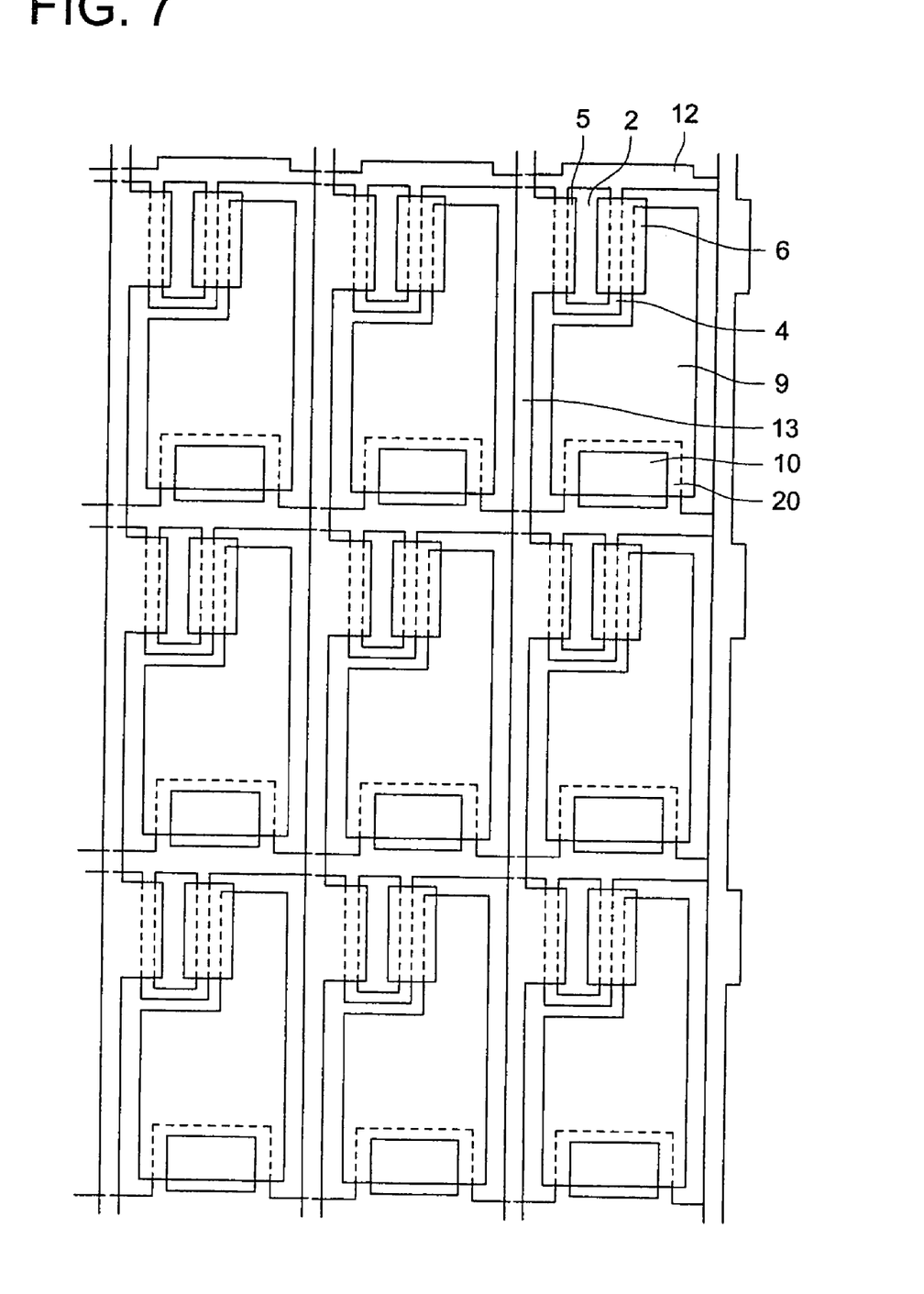
FIG. 7 shows one embodiment of the structure of the thin-film transistor sheet in the invention.

FIG. 7 shows one embodiment of the structure of the thin-film transistor sheet in the invention. In FIG. 7, the semiconductor layer 4 is coated as a continuous layer on the entire surface on which the semiconductor layer is to be formed. Electrode 10 is formed in the insulation layer at the additional capacitor 20 in the same way as the gate electrode 2. In FIG. 7, numerical number 5 is a drain electrode, numerical number 6 a source electrode, numerical number 9 an output electrode, numerical number 12 a gate busline, and numerical number 13 a source busline.

Thus, the method, comprising forming the insulation layer and then forming the gate electrode comprised of a fluid electrode material which has been supplied to the insulation layer and has been allowed to permeate the insulation layer, levels the insulation layer surface and provides the gate electrode having a smooth surface on the semiconductor layer side. The smooth surface of the gate electrode thus obtained can prevent gate leakage or breakdown caused by unevenness such as hillocks, and can also prevent gate leakage or breakdown caused by edge portions of the gate busline or the gate electrode often integrated with the gate busline.

In addition, lowering of thin-film transistor yield or fluctuation of thin-film transistor performance, which is attributed to deterioration of smoothness of an interface between the organic semiconductor layer and the gate electrode caused by the hillocks or edge portions, can be minimized.

In view of layer properties such as layer surface smoothness, layer thickness stability and thin layer formation ability, sputtering layers are ordinarily used. However, the process of the invention makes it possible to apply to the gate busline a conductive layer formed according to a vacuum deposition method, a screen printing method, an ink jet method or a plating method, all of which lower the layer properties above but decrease cost.

Controlling the thickness of the insulation layer, parasitic capacitance occurring at portions between the gate busline and a source electrode, a drain electrode, a pixel electrode or a source busline can be reduced, whereby retardation on drive of the TFT sheet can be restrained. In view of the above, the thickness of the insulation layer is from 0.5 to 10 μm, and preferably from 1 to 5 μm.

As a semiconductor material constituting a semiconductor layer, known ones such as a-Si (amorphous silicone), p-Si (poly-silicone) and an organic semiconductor material are used, and an organic semiconductor material is preferably used. As the organic semiconductive material, π-conjugate materials are used. Examples of the π-conjugate materials include polypyrroles such as polypyrrole, poly(N-substituted pyrrole), poly(3-substituted pyrrole), and poly(3,4-disubstituted pyrrole); polythiophenes such as polythiophene, poly (3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly(p-phenylenevinylene); polyanilines such as polyaniline, poly(N-substituted aniline), poly(3-substituted aniline), and poly(2,3-substituted aniline); polyacetylenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene;

polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group; polymers such as polyvinyl carbazoles, polyphenylene sulfide, and polyvinylene sulfide; and polycyclic condensation products described in Japanese Patent O.P.I. Publication No. 11-195790.

Further, oligomers having repeating units in the same manner as in the above polymers, for example, thiophene hexamers including α-sexithiophene, α,ω-dihexyl-α-sexithiophene, α,ω-dihexyl-α-quiinquethiophene, and α,ω-bis(3-butoxypropyl)-α-sexithiophene, or styrylbenzene derivatives, can be suitably employed.

Further, listed are metallophthalocyanines such as copper phthalocyanine, and fluorine-substituted copper phthalocyanines described in Japanese Patent O.P.I. Publication No. 11-251601; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tretracarboxylic acid diimide, N,N'-bis(1H,1H-perfluoroctyl) naphthalene 1,4,5,8-tetracarboxylic acid diimide derivatives, N,N'-bis(1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarbocylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines.

Of these π conjugate compounds, preferably employed is at least one selected from the group consisting of oligomers which have thiophene, vinylene, thienylenevinylene, phenylenevinylene, p-phenylene, their substitution product or at least two kinds thereof as a repeating unit and have a repeating unit number n of from 4 to 10, polymers which have the same unit as above and a repeating unit number n of at least 20, condensed polycyclic aromatic compounds such as pentacene, fullerenes, condensed cyclic tetracarboxylic acid diimides of condensed ring compounds, and metallophthalocyanines.

Further, employed as other materials for organic semiconductors may be organic molecular complexes such as a tetrathiafulvalene (TTF)-tetracyanoquinodimethane (TCNQ) complex, a bisethylenetetrathiafulvalene (BEDTTTF)-perchloric acid complex, a BEDTTTF-iodine complex, and a TCNQ-iodine complex. Still further, employed may be a conjugate polymers such as polysilane and polygermane, as well as organic-inorganic composite materials described in Japanese Patent O.P.I. Publication No. 2000-260999.

In the invention, the organic semiconductor layer may be subjected to a so-called doping treatment (referred to also as simply doping) by incorporating in the layer, materials working as an acceptor which accepts electrons, for example, acrylic acid, acetamide, materials having a functional group such as a dimethylamino group, a cyano group, a carboxyl group and a nitro group, benzoquinone derivatives, or tetracyanoethylene, tetracyanoquinodimethane or their derivatives, or materials working as a donor which donates electrons, for example, materials having a functional group such as an amino group, a triphenyl group, an alkyl group, a hydroxyl group, an alkoxy group, and a phenyl group; substituted amines such as phenylenediamine; anthracene, benzoanthracene, substituted benzoanthracenes, pyrene, substituted pyrene, carbazole and its derivatives, and tetrathiafulvalene and its derivatives.

The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopant. As the dopant in the present invention, a known dopant can be used.

The methods for forming the organic semiconductor layer include a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, a bar coating method, a die coating method, an ink jet method and an LB method. These methods may be used according to kinds of materials used. However, of these, an ink jet method is preferred in view of productivity in which a thin layer with high precision can be easily obtained employing a solution of an organic semiconductive material from the viewpoint of productive efficiency.

When a precursor such as pentacene is soluble in a solvent as disclosed in Advanced Material 1999, Vol. 6, p. 480-483, a precursor layer formed by coating of the precursor solution may be heat treated to form an intended organic material layer.

Another embodiment of the process of the invention for manufacturing the thin-film transistor sheet comprises, after the gate electrode forming step, forming a semiconductor layer as a continuous layer to cover each of the gate electrode of the plural thin-film transistors.

The TFT sheet of the invention can eliminate an influence of the electric field effect of the gate busline, since the gate electrode comprised of an electrode material, which has been allowed to permeate the insulation layer, gives its electric field effect to the semiconductor layer. That is, the TFT sheet employing the TFTs of the invention makes it possible to drive each TFT in which each gate electrode connected to the same gate busline is not substantially influenced by the electric field effect of the gate busline. Accordingly, a semiconductor layer in the specific form is not necessary, and the semiconductor layer can be provided as continuous layer to cover each gate electrode of the plural TFTs of the TFT sheet. This means that the TFT sheet can be manufactured simply and at extremely low cost, since the step of forming a semiconductor layer in the specific form is eliminated during manufacture.

The thickness of the organic semiconductor layer is not specifically limited. The thickness of the organic semiconductor layer is ordinarily not more than 1 μm, and preferably from 10 to 300 nm.

In an embodiment of the invention, materials for forming a source electrode, a drain electrode, a source busline, a gate busline and a pixel electrode, each of which is other than a gate electrode, are not specifically limited, as long as they are electrically conductive. Examples thereof include platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. Platinum, gold, silver, copper, indium, aluminum, indium oxide-tin (ITO) and carbon are preferred. Further, known electrically conductive polymers whose electrical conductivity is improved by doping are preferably used. Examples thereof include electrically conductive polyaniline, electrically conductive polypyrrole, electrically conductive polythiophene, and complex of electrically conductive polyethylenedioxythiophene and polystyrene sulfonic acid. Of these, ones, which provide a low electric resistance at an interface with the semiconductor layer, are preferred.

As a method for forming the electrode, there are a method in which the electrode is formed according to a known photolithography or lift-off method from an electrically conductive layer of the conductive material described above formed according to a vacuum deposition method or a sputtering method, a method in which the electrode is formed according to thermal transfer of the conductive material to a foil of a metal such as aluminum or copper, and a method in which the electrode is formed by etching a resist of the conductive material formed by an ink jet method. The electrode may be formed by ejecting in the form of electrode a solution or dispersion liquid of an electrically conductive polymer or a dispersion liquid of electrically conductive particles onto the surface on which the electrode is to be formed or by subjecting to photolithography or laser ablation the coated layer of the solution or the dispersion liquid. Further, employing ink or conductive paste containing an electrically conductive polymer or electrically conductive particles, the electrode may be forming by printing in the electrode pattern onto the surface on which the electrode is to be formed according to a printing method such as letterpress printing, intaglio printing, planographic printing or screen printing.

Various insulating films may be employed as the gate insulating layer. The insulating layer is preferably an inorganic oxide film comprised of an inorganic oxide with high dielectric constant. Examples of the inorganic oxide include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum oxide or titanium oxide is particularly preferred. An inorganic nitride such as silicon nitride or aluminum nitride can be also suitably used.

The methods for forming the above film include a dry process such as a vacuum deposition method, a molecular beam epitaxial growth method, an ion cluster beam method, a low energy ion beam method, an ion plating method, a CVD method, a sputtering method, or an atmospheric pressure plasma method, a wet process such as a spray coating method, a spin coating method, a blade coating method, a dip coating method, a casting method, a roll coating method, an bar coating method, or a die coating method, and a patterning method such as a printing method or an ink-jet method. These methods can be used due to kinds of materials used in the insulating layer.

As the typical wet process can be used a method of coating a dispersion liquid and drying, the liquid being obtained by dispersing inorganic oxide particles in an organic solvent or water optionally in the presence of a dispersant such as a surfactant, or a so-called sol gel method of coating a solution of an oxide precursor such as an alkoxide and drying.

Among the above, the preferred is an atmospheric pressure plasma method.

The insulating film formation method according to plasma at atmospheric pressure means a method wherein a reactive gas is plasma-excited by discharge conducted at atmospheric pressure or at approximately atmospheric pressure, whereby a thin-film is formed on a substrate. The method (hereinafter referred to also as an atmospheric pressure plasma method) is described in Japanese Patent O.P.I. Publication Nos. 11-61406, 11-133205, 2000-121804, 2000-147209, and 2000-185362. This method can form a thin layer having high performance at high productivity.

It is preferred that the gate insulating layer 3 is comprised of an anodization film or an anodization film and an insulating film. The anodization film is preferably subjected to sealing treatment. The anodization film is formed on a metal capable of being anodized by anodizing the metal according to a known method.

Examples of the metal capable of being anodized include aluminum and tantalum. An anodization treatment method is mot specifically limited and the known anodization treatment method can be used. Anodization treatment forms an oxidization film. An electrolytic solution used in the anodization treatment may be any as long as it can form a porous oxidation film. Examples of electrolytes in the electrolytic solution include sulfuric acid, phosphoric acid, oxalic acid, chromic acid, boric acid, sulfamic acid, benzene sulfonic acid or their salt, and a mixture thereof. Anodization treatment conditions cannot be specified since they vary due to kinds of an electrolytic solution used. Generally, the concentration of the electrolytic solution is from 1 to 80% by weight, temperature of the electrolytic solution is from 5 to 70° C., electric current density is from 0.5 to 60 A/dm$^2$, voltage applied is from 1 to 100 V, and electrolytic time is from 10 seconds to 5 minutes. It is preferred that an aqueous solution of sulfuric acid, phosphoric acid or boric acid is used as an electrolytic solution, and direct current is used. Alternating current can be also used. The concentration of the above acid of the electrolytic solution is preferably from 5 to 45% by weight. Anodization treatment is preferably carried out in the electrolytic solution at an electric current density of from 0.5 to 20 A/dm$^2$ at a temperature of from 20 to 50° C. for 20 to 250 seconds.

As the gate insulating layer, an organic compound film can be also used. Examples of the organic compound used in the organic compound film include polyimide, polyamide, polyester, polyacrylate, a photo-curable resin such as a photoradical polymerizable or photo-cation polymerizable resin, a copolymer containing an acrylonitrile unit, polyvinyl phenol, polyvinyl alcohol, novolak resin, and cyanoethylpullulan.

As a method of forming the organic compound film, the wet process described above is preferably used.

The inorganic oxide film and the organic oxide film can be used in combination and superposed. The thickness of the insulating film above is generally 50 nm to 3 µm, and preferably from 100 nm to 1 µm.

An orientation layer may be provided between the gate insulating layer and the semiconductor channel. As the orientation layer, a self organization layer is preferably used which is formed from a silane coupling agent such as octadecyltrichlorosilane or trichloromethylsilane, alkane phosphoric acid, alkane sulfonic acid, or an alkane carboxylic acid.

It is preferred that the process of the invention further comprises, between the step of the insulation layer providing step and the fluid electrode material supplying step, the step of supplying a resin solution so that the resin is allowed to permeate portions other than portions of the insulation layer where the gate electrode is to be formed.

As the resin, the water soluble binders such as gelatin, a water soluble polymer other than gelatin, latexes, and polyurethanes used in the gate insulating layer above are used. The resin solution is obtained by dissolving or dispersing the water soluble polymer in the solvent or dispersion medium used in the fluid electrode material solution or dispersion above.

The organic thin-film transistor (bottom gate type) of the invention preferably comprises, between the substrate and the gate electrode, a subbing layer containing a compound selected from inorganic oxides or inorganic nitrides or a subbing layer containing a polymer.

The inorganic oxides contained in the subbing layer include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. The inorganic nitrides include silicon nitride and aluminum nitride.

Of these, silicon oxide, aluminum oxide, tantalum oxide, titanium oxide or silicon nitride is preferred.

In an embodiment of the invention, the subbing layer containing a compound selected from inorganic oxides or inorganic nitrides is preferably formed according to the atmospheric pressure plasma method described above, whereby a layer with high performance can be formed with high productivity.

Examples of the polymer used in the subbing layer include a polyester resin, a polycarbonate resin, a cellulose resin, an acryl resin, a polyurethane resin, a polyethylene resin, a polypropylene resin, a polystyrene resin, a phenoxy resin, a norbornene resin, an epoxy resin, vinyl chloride-vinyl acetate copolymer, a vinyl chloride resin, vinyl acetate-vinyl alcohol copolymer, a partially saponificated vinyl chloride-vinyl acetate copolymer, vinyl chloride-vinylidene chloride copolymer, vinyl chloride-acrylonitrile copolymer, ethylene-vinyl alcohol copolymer, polyvinyl alcohol, chlorinated polyvinyl chloride, ethylene-vinyl chloride copolymer, ethylene-vinyl acetate copolymer, a polyamide resin, an ethylene-butadiene resin, a butadiene-acrylonitrile resin, a silicone resin, and a fluorine-contained resin.

In an embodiment of the invention, the substrate 1 is a resin sheet comprised of a resin. Examples of the resin sheet include resin sheets comprised of, for example, polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of such a resin sheet makes it possible to decrease weight, to enhance portability, and to enhance durability against impact due to its flexibility, as compared to glass.

EXAMPLES

Next, the present invention will be explained employing examples, but is not limited thereto. In the examples, "parts" is part by weight, unless otherwise specified. In the following examples and comparative examples, a thin-film transistor sheet (TFT sheet) having the structure as shown in FIG. 7 was prepared. The TFT sheet as shown in FIG. 7 is an additional capacitor type. In FIG. 7, the semiconductor layer 4 is coated as a continuous layer on the entire surface on which the semiconductor layer is to be formed. A drain electrode 5 and a source electrode 6 are connected through the semiconductor layer 4, and further through a gate busline 12 and a source busline 13. Electrode 10 is formed in the insulation layer at the additional capacitor 20 in the same way as the gate electrode 2 is formed according to the process of the invention. In FIG. 7, numerical number 9 is an output electrode.

Example 1

The silver paste available on the market was printed on a 200 μm thick PES film sheet according to a screen printing method to form a gate busline with a thickness of 3 μm and with L/S=50 μm, which was hardened by heating. Snowtex-PSM with a solid content of 20% by weight (produced by Nissan Kagaku Co., Ltd.) was coated on the gate busline to form and dried to form an insulation layer with a thickness of 3 μm.

An electrically conductive polymer solution, in which 0.05% by weight of a nonionic surfactant (polyoxyethylene-alkyl ether) was added to an aqueous dispersion (BAYTRON P produced by Bayer Co., Ltd.) of a PEDOT (polyethylenedioxythiophene)-PSS (polystyrene sulfonic acid) complex was ejected onto the insulation layer (at the portion as shown in FIG. 8) according to a piezo type ink jet head, where the solution was allowed to permeate the insulation layer and dried to form a gate electrode. At this time, an electrode for additional capacitor may be formed.

Subsequently, the resulting material was subjected to atmospheric pressure plasma discharge treatment under the following conditions to obtain a 20 nm thick silicon oxide layer as a gate insulating layer.

(Gas Used)

| | |
|---|---|
| Inert gas: Helium | 98.25% by volume |
| Reactive gas: an oxygen gas | 1.5% by volume |
| Reactive gas: tetraethoxysilane vapor (bubbled in an argon gas) | 0.25% by volume |
| (Condition of discharge) | |
| Discharge output power: 10 W/cm$^2$ | |

The resulting silicon oxide gate insulating layer was further subjected to atmospheric pressure plasma discharge treatment employing trimethoxypropylsilane as a reactive gas to give a moisture repellent property.

Pentacene sublimation-purified was vacuum deposited onto the resulting gate insulation layer to form a semiconductor layer with a thickness of 50 nm. At this time, the pentacene may be deposited either in the specific form through a mask or entirely on the surface of the gate insulating layer.

<Formation of Organic Semiconductor Layer Protective Layer>

An aqueous polyvinyl alcohol solution, in which purified polyvinyl alcohol was dissolved in water sufficiently purified employing a super pure water manufacturing apparatus, was coated on the organic semiconductor layer, and dried at 100° C. in a nitrogen atmosphere to obtain an organic semiconductor layer protective layer of polyvinyl alcohol with a thickness of 1 μm.

<Formation of Light Sensitive Layer>

The following compositions A and B were individually kneaded, and the kneaded composition A, B, and polyisocyanante compound described above were mixed in a ratio by weight of 100:2.39:0.37, and further stirred in a dissolver to obtain a coating solution.

The resulting coating solution was further ultrasonic dispersed, coated on the protective layer employing an extrusion coater, and dried at 100° C. for 5 minutes to obtain a light sensitive layer with a thickness of 0.3 μm.

Composition A

| | |
|---|---|
| Fe—Al ferromagnetic metal powder | 100 parts |
| Polyrethane resin (Vylon UR-8200, produced by Toyobo Co., Ltd.) | 10.0 parts |
| Polyester resin (Vylon 2800, produced by Toyobo Co., Ltd.) | 5.0 parts |
| Phosphate | 3.0 parts |
| Methyl ethyl ketone | 105.0 parts |
| Toluene | 105.0 parts |
| Cyclohexanone | 90.0 parts |

Composition B

| | |
|---|---|
| α-Alumina (High purity alumina HIT60G, average particles size: 0.18 μm, produced by Sumitomo Kagaku Co., Ltd.) | 100 parts |
| Polyurethane resin (Vylon UR-8700, produced by Toyobo Co., Ltd.) | 15.0 parts |
| Phosphate | 3.0 parts |
| Methyl ethyl ketone | 41.3 parts |
| Toluene | 41.3 parts |
| Cyclohexanone | 35.4 parts |

<Formation of Electrode Material-Repellent Layer>

A silicone rubber solution, in which the following composition 1 was dissolved in Isopar E (isoparaffin type hydrocarbon, produced by Exxon Co. Ltd.) to give a solid content of 10.3% by weight, was coated on the light sensitive layer, and dried to form an electrode material-repellent layer with a thickness of 0.4 μm comprised of silicone rubber.

(Composition 1)

| | |
|---|---|
| α,ω-Divinylpolydimethylsiloxane (Molecular weight 60,000) | 100 parts |
| HMS-501 (Methylhydrogensiloxane-dimethylsiloxane copolymer having methyl groups on the chain ends, SiH number/molecular weight = 0.69 mol/g, produced by Chisso Co., Ltd.) | 7 parts |
| Vinyltris(methylethylketoxyimino)silane | 3 parts |
| SRX-212 (platinum catalyst, produced by Toray Dow Corning Silicone Co., Ltd.) | 5 parts |

<Exposure and Development of Light Sensitive Layer>

The resulting material was exposed at an exposure energy density of 300 mJ/cm$^2$ employing a semiconductor laser with an output power of 100 mW emitting a 830 nm light form a source and drain (pixel) electrode pattern, and developed with a brush, whereby the silicone rubber layer at exposed portions was removed.

<Removal of Organic Semiconductor Layer Protective Layer>

The resulting material was further washed with water to remove the light sensitive layer and polyvinyl alcohol protective layer at the exposed portions.

<Formation of Source and Drain Electrodes, Source Busline and Pixel Electrode>

An aqueous dispersion BAYTRON P (produced by Bayer Co., Ltd.) was coated on the resulting material employing a roll coater, wherein the dispersion was adhered only to the portions at which the silicone rubber layer at exposed portions was removed, and then dried at 100° C.

Further, a dispersion containing silver particles with an average particle size of 8 nm, prepared according to a method disclosed in Japanese Patent O.P.I. Publication No. 11-80647, was coated on the resulting material employing a roll coater, wherein the dispersion was adhered only to the portions at which the silicone rubber layer at exposed portions was removed, and dried at 200° C. for 15 minutes to form a source electrode, a drain electrode, a source busline and a pixel electrode. The resulting electrodes and source busline were comprised of a 20 nm PEDOT-PSS complex layer and a 300 nm Ag particle layer. Thus, TFT sheet sample 1 was obtained.

The TFT sheet sample 1 obtained above exhibited good working property as a p-channel enhancement type FET, and had a carrier mobility at saturated region of 0.4 cm$^2$/V·s.

Example 2

The TFT sheet sample 2 was prepared in the same manner as in the TFT sheet sample 1 above, except that aluminum was vacuum deposited through a mask on the PES film sheet to form a gate busline with a thickness of 3 μm and with L/S=50 μm.

The TFT sheet sample 2 exhibited the same good results as the TFT sheet sample 1.

Example 3

The TFT sheet sample 3 was prepared in the same manner as in the TFT sheet sample 1 above, except that between the gate electrode formation step and the gate insulating layer formation step, the following composition 2 was coated on the insulation layer to incorporate into the insulation layer, dried at 90° C. for 5 minutes, and then hardened by being exposed for 4 seconds employing a 60 W/cm high pressure mercury lamp 10 cm distant from the layer.

(Composition 2)

| | |
|---|---|
| Dipentaerythritol hexacrylate monomer | 60 g |
| Dipentaerythritol hexacrylate dimmer | 20 g |
| Dipentaerythritol hexacrylate trimer or polymer higher than the trimer | 20 g |
| Diethoxybenzophenone (UV-initiator) | 2 g |
| Silicon-containing surfactant | 1 g |
| Methyl ethyl ketone | 75 g |
| Methyl propylene glycol | 75 g |

The TFT sheet sample 3 exhibited the same good results as the TFT sheet sample 1.

The structure above increases a mechanical strength of the insulation layer and adhesion between the gate insulating layer and the insulation layer.

Example 4

The TFT sheet sample 4 was prepared in the same manner as in the TFT sheet sample 1 above, except that a chloroform solution of a purified regioregular poly(3-hexylthiophene) (produced by Ardrich Co., Ltd.) was coated onto the silicon oxide layer in an nitrogen atmosphere employing an applicator, dried at room temperature, and further heated at 50° C. for 30 minutes in an nitrogen atmosphere to form a poly(3-hexylthiophene) semiconductor layer with a thickness of 50 nm, and a PVA semiconductor layer protective layer was not formed.

In the above, the dissolved oxygen in the regioregular poly(3-hexylthiophene) chloroform solution was removed by bubbling with nitrogen.

The TFT sheet sample 4 exhibited good working property as a p-channel enhancement type FET, and had a carrier mobility at saturated region of 0.04 $cm^2/V \cdot s$.

Example 5

The TFT sheet sample 5 was prepared in the same manner as in the TFT sheet sample 1 above, except that an acetone solution of cyanoethylpullulan (produced by Shietsu Kagaku Co., Ltd.) was coated onto the insulation layer, and dried at 90° C. to form a gate insulating layer with a thickness of 300 nm.

The TFT sheet sample 5 exhibited good working property as a p-channel enhancement type FET, and had a carrier mobility at saturated region of 0.3 $cm^2/V \cdot s$.

Comparative Example 1

The TFT sheet sample 6 (comparative) was prepared in the same manner as in the TFT sheet sample 1 above, except that the insulation layer was not provided.

When FET properties were measured, the TFT sheet sample 6 caused break-down between the gate busline and the source busline (discharge breakdown of the insulation layer), and did not function as a thin-film transistor.

Comparative Example 2

The TFT sheet sample 7 (comparative) was prepared in the same manner as in the TFT sheet sample 2 above, except that the insulation layer was not provided.

When FET properties were measured, the TFT sheet sample 7 caused break-down between the gate busline and the source busline (discharge breakdown of the insulation layer), and did not function as a thin-film transistor.

EFFECTS OF THE INVENTION

An embodiment of the present invention can minimize gate leakage caused by hillocks or edge portions of the electrode in a TFT, and can improve quality of a TFT sheet particularly when a resin sheet is used as a substrate of the TFT sheet.

While the preferred embodiments of the present invention have been described using specific terms, such description is for illustrative purposes only, and it is to be understood that changes and variations may be made without departing from the spirit or scope of the appended claims.

What is claimed is:

1. A thin-film transistor sheet comprising a substrate, a gate busline, an insulation layer, a gate electrode comprised of a fluid electrode material, a gate insulating layer, and a semiconductor layer, the gate electrode being formed in the insulation layer and being in contact with the gate busline, wherein the thin-film transistor sheet is manufactured by a process comprising: providing a gate busline on a substrate, providing, on the surface of the substrate on the gate busline side, an insulation layer capable of receiving a fluid electrode material, supplying the fluid electrode material to the insulation layer, the fluid electrode material being allowed to permeate the insulation layer, forming, in the insulating layer, a gate electrode from the permeated fluid electrode material to be in contact with the gate busline, forming a gate insulating layer on the gate electrode and forming a semiconductor layer on the gate insulating layer.

2. The thin-film transistor sheet of claim 1, wherein the substrate is comprised of a resin.

3. The thin-film transistor sheet of claim 1, wherein the fluid electrode material is a solution of an electrically conductive polymer or a dispersion liquid of an electrically conductive polymer.

4. The thin-film transistor sheet of claim 1, wherein the semiconductor layer is comprised of an organic semiconductor material.

* * * * *